(12) United States Patent
Meynier et al.

(10) Patent No.: US 12,440,868 B2
(45) Date of Patent: Oct. 14, 2025

(54) FREQUENCY-TUNABLE ULTRASONIC DEVICE (71) Applicant: VERMON SA, Tours (FR)

(72) Inventors: Cyril Meynier, Tours (FR); Dominique Gross, Tours (FR)

(73) Assignee: VERMON SA, Tours (FR)

( * ) Notice: Subject to any disclaimer, the term of this patent is extended or adjusted under 35 U.S.C. 154(b) by 911 days.

(21) Appl. No.: 17/636,673

(22) PCT Filed: Aug. 18, 2020

(86) PCT No.: PCT/IB2020/000715
§ 371 (c)(1),
(2) Date: Feb. 18, 2022

(87) PCT Pub. No.: WO2021/033030
PCT Pub. Date: Feb. 25, 2021

(65) Prior Publication Data
US 2022/0314274 A1 Oct. 6, 2022

Related U.S. Application Data (60) Provisional application No. 62/889,623, filed on Aug. 21, 2019.

(51) Int. Cl.
B06B 1/02 (2006.01)
B06B 1/06 (2006.01)
(52) U.S. Cl.
CPC .............. B06B 1/0292 (2013.01); B06B 1/06 (2013.01); B06B 1/0269 (2013.01)

(58) Field of Classification Search
CPC ....... B06B 1/0292; B06B 1/06; B06B 1/0629; B06B 1/0603
(Continued)

(56) References Cited

U.S. PATENT DOCUMENTS

2005/0162040 A1* 7/2005 Robert .................. H03H 9/173
310/322
2013/0162102 A1 6/2013 Sammoura et al.
(Continued)

FOREIGN PATENT DOCUMENTS

EP 3 459 646 A1 3/2019

OTHER PUBLICATIONS

European Patent Office, International Search Report issued in corresponding Application No. PCT/IB2020/000715, mailed Dec. 16, 2020.

Primary Examiner — Derek J Rosenau
(74) Attorney, Agent, or Firm — Stites & Harbison, PLLC; Jeffrey A. Haeberlin (57) ABSTRACT An ultrasonic device, comprising an ultrasonic transducer (400) comprising: a membrane (405) suspended above a cavity (403) arranged on the upper surface side of a substrate (401); a piezoelectric layer (407) attached to a surface of the membrane (405); a first electrode (E1) arranged on the lower surface side of the cavity (403); and a second electrode (E3) arranged on the upper surface side of the cavity (403), in contact with the piezoelectric layer (407), the device further comprising a control circuit (CTRL) connected to the first (E1) and second (E3) electrodes and capable of applying a first control voltage (VDC) on the first electrode (E1), and a second control voltage (VAC) different from the first voltage on the second electrode (E3).

11 Claims, 3 Drawing Sheets (58) Field of Classification Search
USPC .................................................. 310/322, 334
See application file for complete search history.

(56) References Cited

U.S. PATENT DOCUMENTS

2017/0326591 A1    11/2017  Apte et al.
2020/0156109 A1*   5/2020   Hajati .................. B06B 1/0622

* cited by examiner

Fig 8 to an ultrasonic inspection device for airborne ultrasound
FREQUENCY-TUNABLE ULTRASONIC DEVICE

TECHNICAL BACKGROUND

The present disclosure relates to the field of ultrasonic inspection. It more particularly aims at an airborne ultrasonic inspection device comprising an ultrasonic transducer and an electronic circuit for controlling the transducer.

PRIOR ART

An ultrasonic inspection device conventionally comprises one or a plurality of ultrasonic transducers, for example, a plurality of ultrasonic transducers arranged in an array, linear or not. In operation, the transducer assembly is arranged opposite a body to be analyzed. The device further comprises an electronic control circuit capable of applying electric excitation signals to the transducers to cause the emission of ultrasound waves by the transducers, towards the body to be analyzed. The ultrasound waves emitted by the transducers are reflected by the body to be analyzed (by its internal and/or surface structure), and then return to the transducers, which convert them back into electric signals. The electric response signals are read by the electronic control circuit and may be stored and analyzed to deduce therefrom information relative to the studied body.

It would be desirable to at least partly improve certain aspects of known ultrasound inspection devices.

SUMMARY

To achieve this, an embodiment provides an ultrasonic device, comprising an ultrasonic transducer comprising:
- a membrane suspended above a cavity arranged on the upper surface side of a substrate;
- a piezoelectric layer attached to a surface of the membrane;
- a first electrode arranged on the lower surface side of the cavity; and
- a second electrode arranged on the upper surface side of the cavity, in contact with the piezoelectric layer,
the device further comprising a control circuit connected to the first and second electrodes and capable of applying a first control voltage on the first electrode, and a second control voltage different from the first voltage on the second electrode.

According to an embodiment, the ultrasonic transducer further comprises a third electrode on the upper surface side of the cavity, the first control voltage being applied between the first electrode and the third electrode.

According to an embodiment, the second control voltage is applied between the second electrode and the third electrode.

According to an embodiment, the ultrasonic transducer further comprises a fourth electrode insulated from the third electrode on the upper surface side of the cavity, the second control voltage being applied between the second electrode and the fourth electrode.

According to an embodiment, the piezoelectric layer is arranged on the upper surface of the membrane, and the second electrode is in contact with the upper surface of the piezoelectric layer.

According to an embodiment, the third electrode is in contact with the lower surface of the piezoelectric layer.

According to an embodiment, the fourth electrode is arranged above the third electrode and is in contact with the lower surface of the piezoelectric layer.

According to an embodiment, the control circuit is configured to, during a phase of emission of an ultrasound wave, apply a DC bias voltage on the first electrode, and apply an AC excitation voltage on the second electrode.

According to an embodiment, the control circuit is configured to, during a phase of reception of an ultrasound wave, apply a DC bias voltage on the first electrode, and read an AC voltage generated on the second electrode under the effect of the received ultrasound wave.

According to an embodiment, the control circuit is capable of varying the level of the DC bias voltage applied to the first electrode to vary the resonance frequency of the ultrasonic transducer.

According to an embodiment, the membrane is made of a semiconductor material.

According to an embodiment, the substrate is made of a semiconductor material.

According to an embodiment, the cavity is formed in a dielectric layer coating the upper surface of the substrate.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various possible applications of the described devices have not been detailed, the described embodiments being compatible with usual applications of ultrasound inspection devices, particularly for airborne ultrasound applications. Further, the properties (frequencies, shapes, amplitudes, etc.) of the electric excitation signals applied by the control circuit to the ultrasonic transducers have not been detailed, the described embodiments being compatible with the excitation signals currently used in ultrasound systems, which may be selected according to the considered application and in particular to the nature of the body to be analyzed and to the type of information which is desired to be acquired. Similarly, the various processings applied to the electric signals delivered by the ultrasonic transducers and read by the control circuit to extract useful information relative to the body to be analyzed have not been detailed, the described embodiments being compatible with processings currently used in ultrasonic inspection systems. Further, the forming of the ultrasonic transducers and of the control circuits of the described analysis devices has not been detailed, the detailed implementation of such elements being within the abilities of those skilled in the art based on the functional indications provided in the present description.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
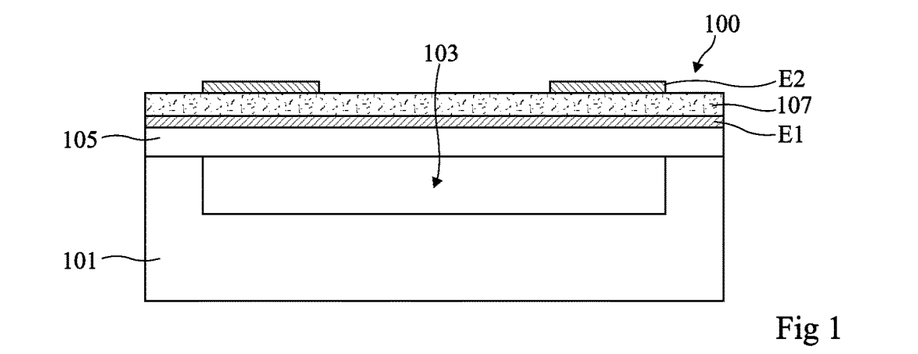
FIG. 1 is a cross-section view schematically showing an example of an ultrasonic transducer.

FIG. 1 is a cross-section view schematically showing an example of an ultrasonic transducer 100.

Transducer 100 is a PMUT-type (Piezoelectric Micromachined Ultrasonic Transducer) piezoelectric transducer. It comprises a substrate 101, a cavity 103 arranged on the upper surface side of substrate 101, and a flexible membrane 105 suspended above cavity 103. In this example, cavity 103 extends vertically in substrate 101, from the upper surface of the substrate. Membrane 105 extends above cavity 103 and is attached by its lower surface to the upper surface of substrate 101 at the periphery of cavity 103.

Transducer 100 further comprises, on the upper surface of membrane 105, a vertical stack comprising, in the order from the upper surface of membrane 105, a lower electrode E1, a layer 107 made of a piezoelectric material, and an upper electrode E2.

In the shown example, lower electrode E1 is formed by a conductive layer continuously extending over the entire upper surface of membrane 105. Further, in this example, piezoelectric layer 107 continuously extends over the entire upper surface of electrode E1. Upper electrode E2 is formed by a conductive layer located above a portion only of the upper surface of cavity 103. More particularly, in the shown example, electrode E2 has, in top view, the shape of a ring-shaped strip located vertically in line with a peripheral portion of cavity 103. Thus, a central portion of cavity 103 is not covered with electrode E2.

When a voltage is applied between electrodes E1 and E2, a vertical electric field is generated in the portion of piezoelectric layer 107 covered with electrode E2. This results in an expansion or in a contraction of said portion of piezoelectric layer 107 in the horizontal direction, under the effect of the transverse piezoelectric coefficient d31 of the material of layer 107. This creates mechanical stress causing a curving of membrane 105. When an appropriate AC excitation voltage is applied between electrodes E1 and E2, membrane 105 starts vibrating under the effect of the variation of the curving stress exerted by piezoelectric layer 107, causing the emission of an ultrasound acoustic wave.

Conversely, when the transducer receives an ultrasound acoustic wave, membrane 105 starts vibrating under the effect of the mechanical pressure variation, causing the occurrence of an AC voltage between electrodes E1 and E2 of the transducer (due to the deformations of piezoelectric layer 107).

Transducer 100 may be coupled to an electronic control circuit (not shown) configured to, during an emission phase, apply between electrodes E1 and E2 an AC excitation voltage capable of causing the emission of an ultrasound acoustic wave by the transducer and, during a receive phase, read between electrodes E1 and E2 an AC voltage generated under the effect of a received ultrasound acoustic wave.

The operating frequency of the transducer is determined by its resonance frequency, which depends on various parameters and in particular on the geometric and mechanical characteristics of the membrane and of the cavity, and on the nature of the output medium (for example a gas such as air, or a liquid medium, or a solid medium).

Figure 2:
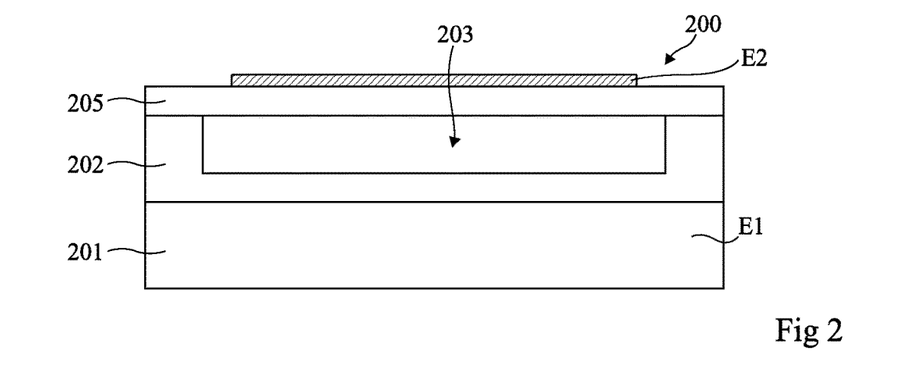
FIG. 2 is a cross-section view schematically showing another example of an ultrasonic transducer.

FIG. 2 is a cross-section view schematically showing an example of an ultrasonic transducer 200.

Transducer 200 is a CMUT-type (Capacitive Micromachined Ultrasonic Transducer) capacitive transducer. It comprises a substrate 201, a cavity 203 arranged on the upper surface side of substrate 201, and a flexible membrane 205 suspended above cavity 203. In this example, cavity 203 is formed in a dielectric layer 202 coating the upper surface of substrate 201. Cavity 203 extends vertically in dielectric layer 202, from the upper surface of layer 202. Membrane 205 extends above cavity 203 and is attached by its lower surface to the upper surface of dielectric layer 202 at the periphery of cavity 203.

Transducer 200 comprises a lower electrode E1 arranged on the bottom side of cavity 203. In the shown example, substrate 201 is made of a doped semiconductor material and forms the lower electrode E1 of the transducer.

Transducer 200 further comprises an upper electrode arranged above cavity 203 and mechanically secured to membrane 205. In the shown example, upper electrode E2 is formed by a conductive layer extending on the upper surface of membrane 205 above cavity 203.

In operation, a DC bias voltage is applied between the lower and upper electrodes E1 and E2 of the transducer. When an appropriate AC excitation voltage, superposed to the DC bias voltage, is applied between electrodes E1 and E2, membrane 205 starts vibrating under the effect of the variation of the electrostatic force exerted between electrodes E1 and E2, causing the emission of an ultrasound acoustic wave. Conversely, when the transducer receives an ultrasound acoustic wave, the flexible membrane starts vibrating under the effect of the mechanical pressure variation, causing the occurrence of an AC voltage superimposed to the DC bias voltage between electrodes E1 and E2 (due to the capacitance variation between electrodes).

Transducer 200 may be coupled to an electronic control circuit (not shown) configured to, during a transmission phase, apply between electrodes E1 and E2 an excitation voltage superimposed to a DC bias voltage, to cause the emission of an ultrasound wave by the transducer and, during a reception phase, apply between electrodes E1 and E2 a DC bias voltage and read between said electrodes an AC voltage generated under the effect of a received ultrasound wave.

Here again, the operating frequency of the transducer is determined, at least in part, by its resonance frequency, which depends on various parameters and in particular on the geometric and mechanical characteristics of the membrane and of the cavity.

PMUT transducers and CMUT transducers have similarities and differences. Both have a thin plate behavior according to Timoshenko's theory. Further, both have an eigenfrequency linked to their dimensions and to their stiffness.

PMUT transducers have a relatively linear behavior, while CMUT transducers are intrinsically non-linear, due to the electrostatic nature of the membrane actuation force, proportional to the square of the ratio of the voltage to the distance between electrodes.

CMUT transducers have a remarkable property known as the spring softening effect, linked to the non-linear characteristic of the electrostatic force. Essentially, when a DC bias voltage is applied between electrodes E1 and E2 of the transducer, causing a deflection of the membrane, the frequency of the membrane oscillations around the position of equilibrium is shifted downwards. In other words, the resonance frequency of the transducer decreases. This phenomenon is illustrated in FIG. 3.

Figure 3:
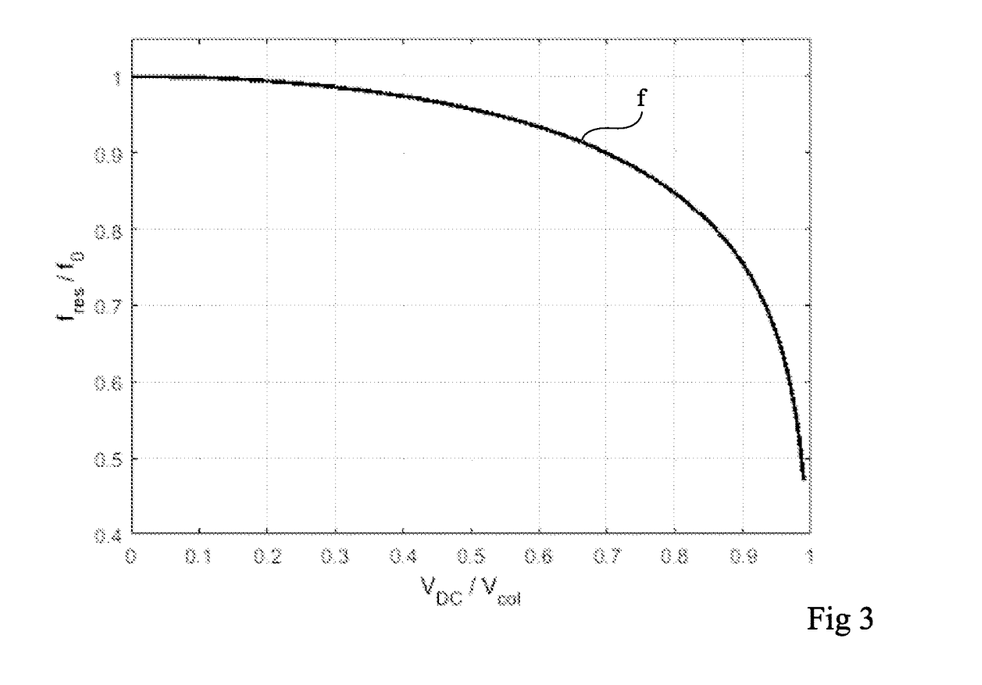
FIG. 3 is a diagram illustrating the behavior of an ultrasonic transducer of the type described in relation with FIG. 1.

FIG. 3 is a diagram showing, in a curve f, for a CMUT transducer of the type described in relation with FIG. 2, the variation of resonance frequency $f_{res}$ of the transducer normalized with respect to its eigenfrequency $f_0$ (resonance frequency in the absence of any electric biasing), in ordinates, from 0 to 1, according to the DC bias voltage $V_{DC}$ applied between electrodes E1 and E2 normalized with respect to the collapse voltage $V_{col}$ of the membrane, that is, the voltage resulting in abutting the membrane against the bottom of the cavity, in abscissas, from 0 to 1.

A monotonous decrease of frequency $f_{res}$ according to voltage $V_{DC}$ can effectively be observed. In the shown example, such a decrease is non-linear. More particularly, in the present example, the derivative (director coefficient of the tangent to the slope) of function f such that $f_{res}=f(V_{DC})$ increases monotonously (in absolute value) according to voltage $V_{DC}$. In other words, the decrease of the transducer resonance frequency $f_{res}$ accelerates when voltage $V_{DC}$ increases.

According to an aspect of an embodiment, it is provided to use the above-mentioned spring softening effect of CMUT transducers to allow an electric setting of the resonance frequency of a PMUT transducer. For this purpose, a hybrid transducer structure combining a PMUT transducer dynamic actuation mode and a CMUT transducer static actuation mode is provided. This advantageously enables to use a same transducer successively at different ultrasound frequencies.

Figure 4:
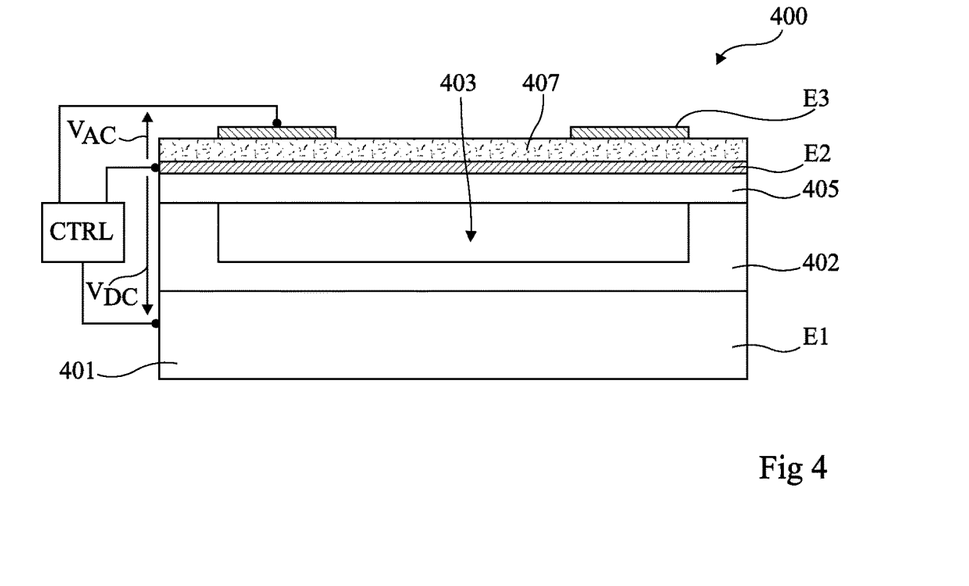
FIG. 4 is a cross-section view schematically showing an example of an ultrasonic inspection device according to an embodiment.

FIG. 4 is a cross-section view schematically showing an example of an ultrasonic inspection device according to an embodiment.

The device of FIG. 4 comprises a transducer 400 and a circuit CTRL for controlling transducer 400.

Transducer 400 comprises a substrate 401, a cavity 403 arranged on the upper surface side of substrate 401, and a flexible membrane 405 suspended above cavity 403. In this example, cavity 403 is formed in a dielectric layer 402 coating the upper surface of substrate 401. Cavity 403 extends vertically in dielectric layer 402, from the upper surface of layer 402. Membrane 405 extends above cavity 403 and is attached by its lower surface to the upper surface of dielectric layer 402 at the periphery of cavity 403.

Transducer 400 comprises a lower electrode E1 arranged on the bottom side of cavity 403. In the shown example, substrate 401 is made of a doped semiconductor material, for example, silicon, and forms the lower electrode E1 of the transducer.

Dielectric layer 402 is for example made of silicon oxide. As an example, layer 402 is directly in contact, by its lower surface, with the upper surface of substrate 401. In the shown example, cavity 403 is non-through, that is, it does not emerge on the lower surface side of layer 402. In other words, a lower portion of the thickness of layer 402 coats the upper surface of substrate 401 at the bottom of cavity 403. The described embodiments are however not limited to this specific case.

As an example, the depth of cavity 403 is in the range from 10 nm to 5 µm, for example, in the order of 500 nm. The lateral dimensions of cavity 403 are for example in the range from 5 to 500 µm.

Membrane 405 is for example made of a doped or non-doped semiconductor material, for example, silicon. As an example, the thickness of membrane 405 is in the range from 10 nm to 10 µm.

Transducer 400 further comprises, on the upper surface of membrane 405, a vertical stack comprising, in the order from the upper surface of membrane 405, an intermediate electrode E2, a layer 407 made of a piezoelectric material, and an upper electrode E3.

In the shown example, intermediate electrode E2 is formed by a conductive layer, for example, metallic, continuously extending over the entire upper surface of membrane 405. Electrode E2 is for example directly in contact, by its lower surface, with the upper surface of membrane 405, over the entire upper surface of membrane 405. Electrode E2 is for example made of aluminum, titanium, platinum, and/or molybdenum. The thickness of electrode E2 is for example in the range from 200 nm to 1 µm.

Piezoelectric layer 407 for example continuously extends over the entire upper surface of membrane 405. Layer 407 is for example directly in contact, by its lower surface, with the upper surface of electrode E2, over the entire upper surface of electrode E2. Layer 407 is for example made of PZT (Lead Zirconate Titanate), of PMN-PT (Lead Magnesium Niobate-Lead Titanate), of $LiNbO_3$ (Lithium Niobate), of AlN (Aluminium Nitride), or of any other piezoelectric material. The thickness of piezoelectric layer 407 is for example in the range from 300 nm to 5 µm.

In this example, upper electrode E3 is formed by a conductive layer, for example, metallic, located above a portion only of the upper surface of cavity 403. More particularly, in the shown example, electrode E3 has, in top view, the shape of a ring-shaped strip located vertically in line with a peripheral portion of cavity 403. Thus, a central portion of cavity 403 is not covered with electrode E3. As a variation (not shown), upper electrode E3 could be localized above the central portion of the cavity only. Electrode E3 is for example directly in contact, by its lower surface, with the upper surface of piezoelectric layer 407. Electrode E3 is for example made of aluminum, titanium, platinum and/or molybdenum. The thickness of electrode E3 is for example in the range from 200 nm to 1 µm.

Control circuit CTRL is connected to electrodes E1, E2, and E3 of the transducer and is configured to, in operation, apply a first control voltage between electrodes E1 and E2, and simultaneously apply a second control voltage different from the first voltage, between electrodes E3 and E2.

More particularly, according to an advantageous embodiment, control circuit CTRL is configured to, during an emission phase, apply a DC bias voltage $V_{DC}$ between electrodes E1 and E2, and simultaneously apply an AC excitation voltage $V_{AC}$ between electrodes E3 and E2.

DC bias voltage $V_{DC}$ generates an electrostatic force of attraction between electrodes E1 and E2, causing a deflection of membrane 405.

AC excitation voltage $V_{AC}$ causes, by piezoelectric effect, an oscillation of the membrane around the position of equilibrium defined by voltage $V_{DC}$, resulting in the emission of an ultrasound wave.

In receive mode, DC bias voltage $V_{DC}$ may be maintained, for example, at the same level as the level applied during the emission phase. Control circuit CTRL is then configured to read an AC voltage generated between electrodes E3 and E2 under the effect of a received ultrasound wave.

The level of the DC bias voltage $V_{DC}$ applied between electrodes E1 and E2 determines the resonance frequency and thus the main operating frequency of the transducer. More particularly, increasing DC bias voltage $V_{DC}$ results in decreasing the apparent mechanical stiffness of membrane 405, due to the above-mentioned spring softening effect, thus causing a decrease in the resonance frequency of the transducer.

Control circuit CTRL enables to adapt the level of DC bias voltage $V_{DC}$ to modify the resonance frequency of the transducer, for example, according to the type of body to be analyzed or to the type of information which is desired to be obtained. The frequency of AC excitation voltage $V_{AC}$ may be accordingly adjusted to correspond to the resonance frequency of the transducer.

It should be noted that in the present example, intermediate electrode E2 is used as a potential reference common to control voltages $V_{DC}$ and $V_{AC}$. Electrode E2 may be coupled, for example, connected, to a node of application of a fixed reference potential of the device, for example, the ground.

Figure 5:
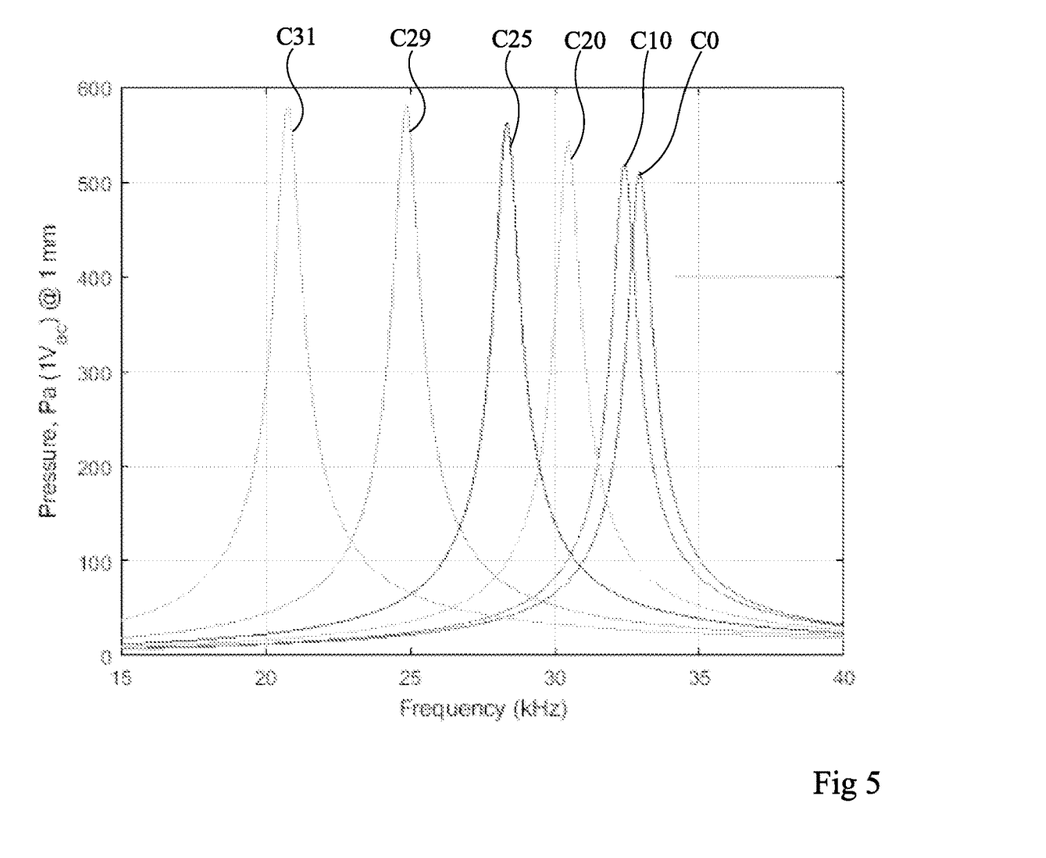
FIG. 5 is a diagram illustrating the behavior of an embodiment of an ultrasonic inspection device of the type described in relation with FIG. 4.

FIG. 5 is a diagram illustrating the behavior of an embodiment of an ultrasonic transducer of the type described in relation with FIG. 4.

The present example considers a transducer in which:
cavity 403 has a lateral dimension (diameter or width) in the order of 1.1 mm and a depth in the order of 3 µm;
membrane 405 is made of silicon and has a thickness in the order of 2 µm; and
piezoelectric layer 407 is made of PZT-5H and has a thickness in the order of 2 µm.

The eigenfrequency of the transducer is in the order of 40 kHz in vacuum, and in the order of 33 kHz in air, which is the targeted medium of use of the transducer. The collapse frequency of the membrane, that is, the voltage threshold $V_{DC}$ resulting from the placing into contact of the membrane with the bottom of the cavity, is approximately 32.5 V.

The diagram of FIG. 5 comprises six curves C0, C10, C20, C25, C29, and C31 respectively showing, for six different levels of DC bias voltage $V_{DC}$ applied between electrodes E1 and E2 of the transducer, the variation of the acoustic pressure emitted by the membrane during an emission phase (in ordinates, in Pa) according to the frequency of the AC excitation voltage $V_{AC}$ applied between electrodes E3 and E2 of the transducer (in abscissas, in kHz). In the present example, the emitted pressure is measured 1 mm above the membrane, for an AC voltage $V_{AC}$ having a 1-V amplitude. Curves C0, C10, C20, C25, C29, and C31 have been measured for respective levels of DC bias voltage $V_{DC}$ in the order of 0 V, 10 V, 20 V, 25 V, 29 V, and 31 V.

As shown in FIG. 5, the resonance frequency of the transducer non-linearly decreases when bias voltage $V_{DC}$ increases, from approximately 33 kHz for a zero voltage $V_{DC}$, to approximately 21 kHz for a voltage $V_{DC}$ in the order of 31 V. It can further be shown in FIG. 5 that the acoustic pressure level at the resonance frequency of the transducer remains substantially constant when the level of voltage $V_{DC}$ varies.

The transducer of the example of FIG. 5 may for example be used in a distance measurement device of motor vehicle parking radar type. Shifting downwards the operating frequency of the transducer may in particular enable to increase the maximum obstacle detection distance, at the cost of a lower measurement accuracy. The operating frequency may however be increased by decreasing bias voltage $V_{DC}$ when the distance to the obstacle decreases, to improve the accuracy of the measurement.

Figure 6:
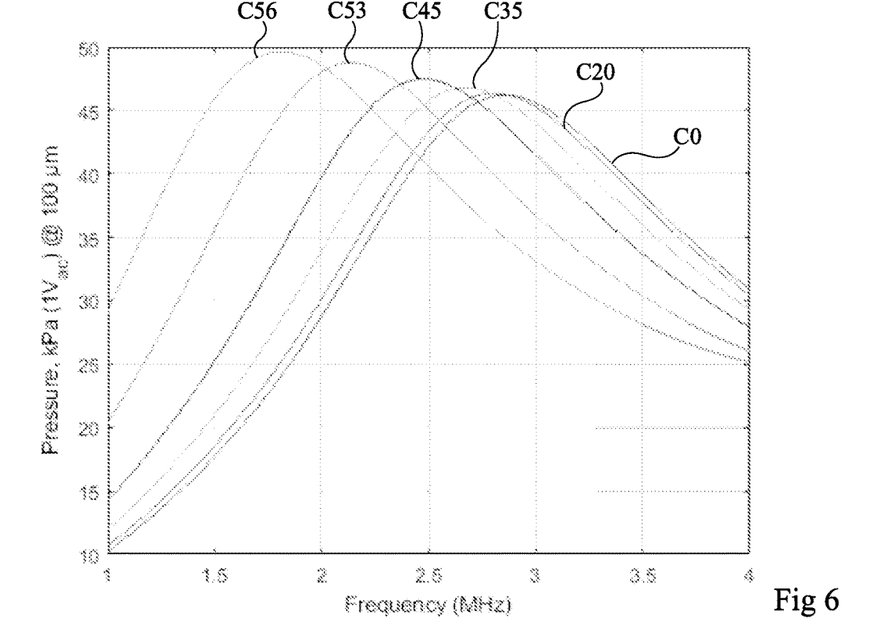
FIG. 6 is a diagram illustrating the behavior of another embodiment of an ultrasonic inspection device of the type described in relation with FIG. 4.

FIG. 6 is a diagram illustrating the behavior of another embodiment of an ultrasonic transducer of the type described in relation with FIG. 4.

The present example considers a transducer where:
cavity 403 has a lateral dimension (diameter or width) in the order of 100 µm and a depth in the order of 15 nm;
membrane 405 is made of silicon and has a thickness in the order of 2 µm; and
piezoelectric layer 407 is made of PZT-5H and has a thickness in the order of 2 µm.

The eigenfrequency of the transducer is in the order of 3.5 MHz in vacuum, and in the order of 2.9 MHz in water, which is the targeted medium of use of the transducer. The collapse voltage of the membrane is approximately 59 V.

The diagram of FIG. 6 comprises six curves C0, C20, C35, C45, C53, and C56 respectively showing, for six different levels of DC bias voltage $V_{DC}$ applied between electrodes E1 and E2 of the transducer, the variation of the acoustic pressure emitted by the membrane during an emission phase (in ordinates, in kPa) according to the frequency of the AC excitation voltage $V_{AC}$ applied between electrodes E3 and E2 of the transducer (in abscissas, in MHz). In the present example, the emitted pressure is measured 100 µm above the membrane, for an AC voltage $V_{AC}$ having a 1-V amplitude. Curves C0, C20, C35, C45, C53, and C56 have been measured for respective levels of DC bias voltage $V_{DC}$ in the order of 0 V, 20 V, 35 V, 45 V, 53 V, and 56 V.

As shown in FIG. 6, the resonance frequency of the transducer non-linearly decreases when bias voltage $V_{DC}$ increases, from approximately 2.9 MHz for a zero voltage $V_{DC}$, to approximately 1.75 MHz for a voltage $V_{DC}$ in the order of 56 V. It can further again be observed in FIG. 6 that the acoustic pressure level at the resonance frequency of the transducer remains substantially constant when the level of voltage $V_{DC}$ varies.

The transducer of the example of FIG. 6 may for example be used in medical imaging applications.

Thus, the device described in relation with FIG. 4 enables to accurately set the operating frequency of the transducer by the adjustment of the level of DC bias voltage $V_{DC}$, without degrading its electro-acoustic efficiency.

Figure 7:
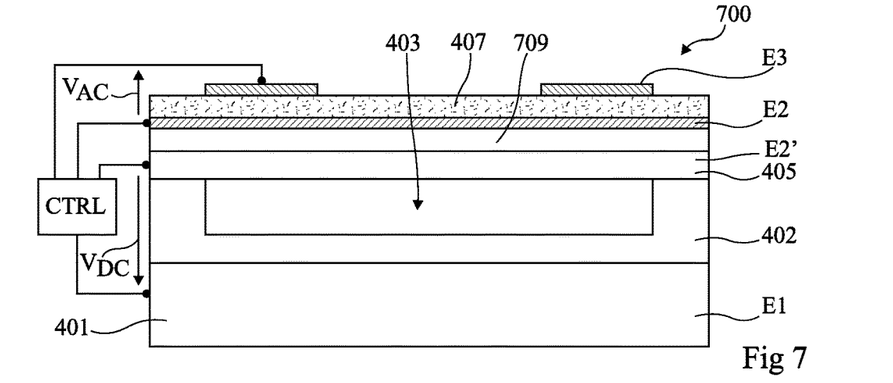
FIG. 7 is a cross-section view schematically showing an alternative embodiment of the device of FIG. 4.

FIG. 7 is a cross-section view schematically showing an alternative embodiment of the ultrasonic inspection device described in relation with FIG. 4.

The device of FIG. 7 differs from the device of FIG. 4 mainly in that, in the device of FIG. 7, the transducer comprises an additional intermediate electrode E2' enabling to have different reference potentials of DC bias voltage $V_{DC}$ and for AC excitation voltage $V_{AC}$.

More particularly, in the example of FIG. 7, the transducer 400 of FIG. 4 is replaced with a transducer 700. Transducer 700 differs from transducer 400 essentially in that, in transducer 700, an electrically-insulating layer 709, for example, made of silicon oxide, forms an interface between membrane 405 and intermediate electrode E2. Layer 700 for example continuously extends over the entire surface of membrane 405. In the shown example, layer 700 is in contact, by its lower surface, with the upper surface of membrane 405 and, by its upper surface, with the lower surface of electrode E2, over substantially the entire surface of the membrane.

In the present example, membrane 405 is made of a conductive material or of a doped semiconductor material, for example, made of doped silicon, and defines an additional intermediate electrode E2' of the transducer. As a variant (not shown), electrode E2' may be formed by a conductive layer, for example, metallic, attached to the membrane and arranged above cavity 403, between the upper surface of membrane 405 and the lower surface of dielectric layer 709, or also on the lower surface side of membrane 405.

Control circuit CTRL is connected to electrodes E1, E2, E2', and E3 of the transducer and is configured to, in operation, apply a first control voltage between electrodes E1 and E2', and simultaneously apply a second control voltage, different from the first voltage, between electrodes E3 and E2.

The operation of the device is for example identical or similar to what has been described in relation with FIG. 4, with the difference that, in the variant of FIG. 7, DC bias voltage $V_{DC}$ is applied between electrodes E1 and E2' of transducer 700.

The provision of different potential references for voltages $V_{AC}$ and $V_{DC}$ may in particular enable to use, within control circuit CTRL, insulated circuits (not detailed) to respectively generate voltages $V_{AC}$ and $V_{DC}$.

Figure 8:
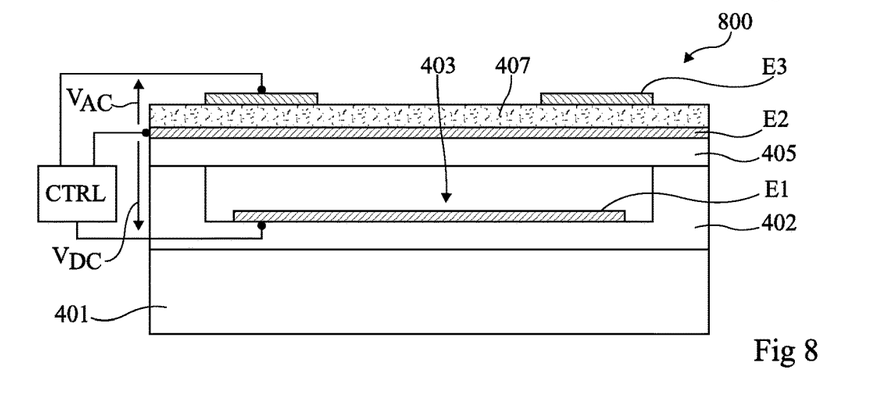
FIG. 8 is a cross-section view schematically showing another alternative embodiment of the device of FIG. 4.

FIG. 8 is a cross-section view schematically showing another alternative embodiment of the ultrasound inspection device described in relation with FIG. 4.

In the example of FIG. 8, the transducer 400 of FIG. 4 is replaced with a transducer 800. Transducer 800 differs from transducer 400 essentially in that, in transducer 800, lower electrode E1, instead of being formed by substrate 401, is formed by a conductive layer, for example, metallic, coating the bottom of cavity 403. In this variant, substrate 401 may be made of an electrically-insulating material.

For the rest, the device of FIG. 8 and its operation are similar to what has been described in relation with FIG. 4.

It should be noted that the variants of FIGS. 7 and 8 may be combined.

Various embodiments and variants have been described. Those skilled in the art will understand that certain features of these various embodiments and variants may be combined, and other variants will occur to those skilled in the art. In particular, the described embodiments are not limited to the examples of dimensions and of materials mentioned in the present disclosure.

Further, the described embodiments are not limited to the above-described examples of arrangement of the electrodes. In particular, electrodes E1, E2, E3 and, possibly, E2', may have other patterns, in top view, than those indicated in the present disclosure.

Further, although a single ultrasonic transducer has been shown and described in the examples of FIGS. 4 to 8, the described embodiments are of course not limited to this specific case. In practice, an ultrasonic inspection device may comprise a plurality of ultrasonic transducers, for example, identical or similar, for example, arranged in an array, linear or not, individually or collectively controllable. It should in particular be noted that the described embodiments may be adapted to RCA-type (Row-Column-Addressing) devices.

Further, the described devices may be used for other applications that the setting of the operating frequency of the transducers. In other words, the described embodiments are not limited to the examples of use described hereabove, where the voltage applied to electrode E1 is a DC bias voltage used to set the resonance frequency of the transducer, and the voltage applied to electrode E3 is an AC voltage for exciting the piezoelectric layer of the transducer. As a variant, for certain applications, it may be provided to use the CMUT portion of the transducer in transmit mode, in which case AC excitation voltage $V_{AC}$ will be applied between terminals E1 and E2 (in the examples of FIGS. 4 and 8) or E1 and E2' (in the example of FIG. 7) superimposed to a possible DC bias voltage $V_{DC}$, and to use the PMUT in receive mode, or conversely.

What is claimed is:

1. An ultrasonic device, comprising an ultrasonic transducer comprising:
   a membrane suspended above a cavity arranged on the upper surface side of a substrate;
   a piezoelectric layer attached to a surface of the membrane;
   a first electrode arranged on the lower surface side of the cavity; and
   a second electrode arranged on the upper surface side of the cavity, in contact with the piezoelectric layer,
   the device further comprising a control circuit connected to the first electrode and the second electrode and capable of simultaneously applying a first control voltage on the first electrode, and a second control voltage different from the first voltage on the second electrode,
   wherein the control circuit is configured to, during a phase of emission of an ultrasound wave, apply a DC bias voltage on the first electrode, and apply an AC excitation voltage on the second electrode, and
   wherein the control circuit is configured to, during a phase of reception of an ultrasound wave, apply a DC bias voltage on the first electrode, and read an AC voltage generated on the second electrode under the effect of the received ultrasound wave.

2. The device according to claim 1, wherein, the ultrasonic transducer further comprises a third electrode on the upper surface side of the cavity, the first control voltage being applied between the first electrode and the third electrode.

3. The device according to claim 2, wherein the second control voltage is applied between the second electrode and the third electrode.

4. The device according to claim 2, wherein the ultrasonic transducer further comprises a fourth electrode insulated from the third electrode on the upper surface side of the cavity, the second control voltage being applied between the second electrode and the fourth electrode.

5. The device according to claim 1, wherein the piezoelectric layer is arranged on the upper surface of the membrane, and the second electrode is in contact with the upper surface of the piezoelectric layer.

6. The device according to claim 3, wherein the third electrode is in contact with the lower surface of the piezoelectric layer, the piezoelectric layer is arranged on the upper surface of the membrane, and the second electrode is in contact with the upper surface of the piezoelectric layer.

7. The device according to claim 4, wherein the fourth electrode is arranged above the third electrode and is in contact with the lower surface of the piezoelectric layer, the piezoelectric layer is arranged on the upper surface of the membrane, and the second electrode is in contact with the upper surface of the piezoelectric layer.

8. The device according to claim 1, wherein the control circuit is capable of varying the level of the DC bias voltage applied to the first electrode to vary the resonance frequency of the ultrasonic transducer.

9. The device according to claim 1, wherein the membrane is made of a semiconductor material.

10. The device according to claim 1, wherein the substrate is made of a semiconductor material.

11. The device according to claim 1, wherein the cavity is formed in a dielectric layer coating the upper surface of the substrate.

\* \* \* \* \*